US012644909B2

(12) United States Patent
Stollwerck et al.

(10) Patent No.: US 12,644,909 B2
(45) Date of Patent: Jun. 2, 2026

(54) SENSORED BUSHING

(71) Applicant: 3M INNOVATIVE PROPERTIES COMPANY, St. Paul, MN (US)

(72) Inventors: Gunther A. J. Stollwerck, Krefeld (DE); Mark Gravermann, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 181 days.

(21) Appl. No.: 18/577,301

(22) PCT Filed: Jun. 24, 2022

(86) PCT No.: PCT/IB2022/055885
§ 371 (c)(1),
(2) Date: Jan. 8, 2024

(87) PCT Pub. No.: WO2023/002276
PCT Pub. Date: Jan. 26, 2023

(65) Prior Publication Data

US 2024/0329087 A1 Oct. 3, 2024

(30) Foreign Application Priority Data

Jul. 22, 2021 (EP) .................................... 21187157

(51) Int. Cl.
*G01R 15/06* (2006.01)
*G01R 15/16* (2006.01)
(Continued)

(52) U.S. Cl.
CPC ............. *G01R 15/06* (2013.01); *G01R 15/16* (2013.01); *H01B 17/583* (2013.01);
(Continued)

(58) Field of Classification Search
CPC ...... G01R 15/06; G01R 15/16; H01B 17/583; H01B 19/00; H01R 13/6683; H02G 15/184
See application file for complete search history.

(56) References Cited

U.S. PATENT DOCUMENTS 3,513,253 A * 5/1970 Woods .................. H01B 17/28 264/262
9,640,904 B2 5/2017 Weinmann et al.
(Continued)

FOREIGN PATENT DOCUMENTS

DE 19547120 A1 6/1997
EP 2608338 A1 11/2013
(Continued)

OTHER PUBLICATIONS

Extended European Search Report received for EP Patent Application No. 21187157.9, mailed on Jan. 5, 2022, 3 pages.
International Search report for PCT International Application No. PCT/IB2022/055885, mailed on Sep. 9, 2022, 5 pages.

*Primary Examiner* — Timothy J Thompson
*Assistant Examiner* — Rhadames Alonzo Miller
(74) *Attorney, Agent, or Firm* — Gregg H. Rosenblatt

(57) ABSTRACT

Bushing for connecting a separable connector to a switchgear or to a transformer in a national grid for distributing electrical power at medium or high voltages. The bushing comprises a) a bushing body of a solidified, electrically insulating casting material; b) a bushing conductor, embedded in the casting material, for conducting power at medium or high voltages into the switchgear or the transformer, and c) an integrated primary capacitor, operable in a high-voltage portion of a voltage divider for sensing a voltage of the bushing conductor. The primary capacitor comprises a low-voltage electrode, a high-voltage electrode and a dielectric. The high-voltage electrode is a section of the bushing conductor. The low-voltage electrode is embedded in the
(Continued)

casting material and comprises a circumferential wall surrounding the bushing conductor and forming a cavity. The dielectric is formed by a portion of the casting material arranged in the cavity. The circumferential wall comprises a mesh of conductive wires forming a plurality of apertures between the conductive wires to allow the casting material radially outside the circumferential wall to be mechanically connected with the casting material in the cavity.

15 Claims, 4 Drawing Sheets

(51) Int. Cl.

| | |
|---|---|
| ***H01B 17/58*** | (2006.01) |
| ***H01B 19/00*** | (2006.01) |
| ***H01R 13/66*** | (2006.01) |
| ***H02G 15/184*** | (2006.01) |

(52) U.S. Cl.
CPC ......... *H01R 13/6683* (2013.01); *H01B 19/00* (2013.01); *H02G 15/184* (2013.01)

(56) References Cited

U.S. PATENT DOCUMENTS

| | | | | |
|---|---|---|---|---|
| 2001/0048308 | A1* | 12/2001 | Potter .................... | G01R 15/16 324/519 |
| 2014/0368221 | A1* | 12/2014 | Weinmann ......... | H01R 13/6683 324/658 |
| 2014/0370741 | A1* | 12/2014 | Bolcato .................. | G01R 15/16 439/471 |
| 2016/0245845 | A1 | 8/2016 | Alberto | |
| 2016/0365670 | A1* | 12/2016 | Bolcato .............. | H01R 13/6683 |
| 2018/0246146 | A1 | 8/2018 | Rohde et al. | |

FOREIGN PATENT DOCUMENTS

| | | | |
|---|---|---|---|
| WO | 2013021402 | A1 | 2/2013 |
| WO | 2016135181 | A1 | 9/2016 |
| WO | 2017012837 | A1 | 1/2017 |
| WO | 2019186607 | A1 | 10/2019 |
| WO | 2020016687 | A1 | 1/2020 |
| WO | 2022069967 | A1 | 4/2022 |
| WO | 2022069971 | A1 | 4/2022 |
| WO | 2022072130 | A1 | 4/2022 |

* cited by examiner

SENSORED BUSHING

FIELD

This disclosure relates to bushings having elements of voltage dividers for sensing an elevated voltage in medium-voltage or high-voltage power distribution networks of a national grid. In particular, it relates to bushings having a primary capacitor useable in such voltage dividers. The disclosure also relates to methods of manufacturing such bushings.

BACKGROUND

For better control and better management of their networks, power network operators are upgrading their networks by adding more and more voltage sensors. Such sensors measure voltage between a current conductor on medium or high voltage and an element on electrical ground. Sensors of this kind are often integrated into standard network accessories, e.g. into connectors or bushings, which otherwise are electrically and mechanically identical to non-sensored accessories. By replacing a non-sensored accessory by a sensored accessory, a sensor can be easily added, i.e. retrofitted, to an existing power network without having to make further changes.

An example of a retrofittable voltage sensor can be found in the International Patent Application WO 2020/016687 A1, in which a sensor for a separable connector comprises an insulating plug that can be inserted into a receptacle of the separable connector. The sensor includes one or more low-voltage capacitors connected to a high-voltage capacitor to form a capacitive voltage divider.

In capacitive voltage dividers, the dividing capacitors are exposed to the elevated voltage of the current conductor of the electrical apparatus and divide that elevated voltage, either in fewer and larger steps via a small number of “larger” capacitors, or in more, smaller steps via a greater number of “smaller” capacitors. While discrete capacitors are often used for the “smaller” capacitors, “larger” capacitors are often not discrete, but integrated capacitors, i.e. capacitors that are formed by structural elements of the sensor rather than by separate electrical elements.

In either case, the capacitors of the voltage divider require adequate electrical insulation in order to reduce the risk of electrical discharges between any capacitor on a high voltage and an element on lower voltage. Due to the strong electrical fields in the vicinity of the dividing capacitors of the high-voltage portion of the voltage divider, the insulating material must be a good insulator and provide a high barrier to discharges. Any void or bubble in the insulating material may give rise to partial discharges.

In a medium-voltage or high-voltage power distribution network, a power cable is typically connected to network apparatus, such as switchgears or transformers, via a traditional bushing that extends from inside the apparatus to outside the apparatus. Traditional, non-sensored bushings have a bushing conductor which is embedded in an insulating body. A separable connector, also often referred to as a removable power connector, mounted at the end of the cable, can be mechanically and electrically connected to the bushing, so that power can be conducted into the apparatus or out of the apparatus.

Elements of a voltage sensor for measuring the voltage of the bushing conductor of a bushing—and thereby the voltage of the power cable—can be integrated into the bushing, making it a “sensored bushing”. A voltage sensor of that general type is described, for example, in the European patent EP 2 740 129 B1.

Advantageously a high-voltage capacitor (the “primary capacitor”), or the entire high-voltage portion, of the voltage divider is accommodated in the bushing, making use of the insulative properties of the body (“bushing body”) of the bushing.

Embedding capacitors of a MV/HV voltage divider in a solidified casting material, e.g. in the casting material of a body of a sensored bushing, is a known method of obtaining a strong electrical insulation, with the added benefit of mechanical rigidity of the voltage divider. When manufacturing such a sensored bushing, a liquid, viscous casting material flows around the capacitors in a mold, filling all available space and thus reducing formation of voids. The casting material is then caused to cure and thereby solidify to form the body of the bushing.

Where a low-voltage electrode of an integrated capacitor in a sensored bushing comprises a contiguous circumferential wall forming a cylindrical cavity, a viscous casting material can only flow into the cavity through the openings at the ends of the cavity. The smaller these openings and the more viscous the casting material, the longer the casting process—and the higher the likelihood of the casting material not filling the entire available space and of voids forming inside the cavity. The resulting sensored bushing will have a higher likelihood of electrical discharges at those voids, and thus be generally less reliable.

Typically, upon solidification and curing of the casting material, the casting material shrinks, while the embedded low-voltage electrode maintains its size, the electrode being mostly made from metal. This shrinkage tends to dissolve the bond between the casting material and the surface of the electrode, so that a gap may develop between the casting material and the electrode surface. Electrical discharges across the gap are likely to happen and will over time destroy the integrity of the sensored bushing, thereby reducing its performance and reliability.

The recently published international patent application WO 2019/186607 A1 addresses similar problems. It suggests a capacitive voltage sensor comprising an electrode comprising a plurality of first elements having an elongated shape, arranged circumferentially side by side to form a tubular body and cantilevered with their distal ends joined to each other and their proximal ends free.

For better performance, i.e. less delamination upon solidification and less voids caused by inconsistent flow of the casting material, further improvement is desirable. It is also desirable to have a sensored bushing at lower cost. It is further desirable to integrate elements of a voltage divider into standard connection elements in MV/HV power networks like bushings.

SUMMARY

The present disclosure attempts to address these needs. It provides a bushing for connecting a separable connector to a switchgear or to a transformer in a power distribution network of a national grid for distributing electrical power at medium or high voltages, the bushing comprising a) a bushing body comprising a solidified, electrically insulating casting material;

b) a bushing conductor, embedded in the casting material, for conducting power at medium or high voltages into the switchgear or the transformer, and c) an integrated primary capacitor, operable in a high-voltage portion of a voltage divider for sensing a voltage of the bushing conductor, wherein the primary capacitor comprises a low-voltage electrode, a high-voltage electrode and a dielectric; wherein the high-voltage electrode is a section of the bushing conductor; wherein the low-voltage electrode is embedded in the casting material and comprises a circumferential wall surrounding the bushing conductor and forming a cavity; wherein the dielectric is formed by a portion of the casting material arranged in the cavity, and wherein the circumferential wall comprises a mesh of conductive wires forming a plurality of apertures between the conductive wires to allow the casting material radially outside the circumferential wall to be mechanically connected with the casting material in the cavity.

During the casting process, when manufacturing the body of the bushing comprising the low-voltage electrode, the large number of apertures in the mesh allow the casting material to flow through the apertures into the cavity more reliably and more quickly. This reduces the likelihood of voids being created in the cavity during casting.

In the low-voltage electrode the large number of smaller apertures in the mesh of conductive wires results in a more even field distribution, better voltage pickup and a higher capacitance of the primary capacitor, compared, for example, to a low-voltage electrode made of a metal sheet into which larger and fewer openings are machined.

After the casting material solidifying, e.g. when the bushing with its low-voltage electrode is in use, the mesh apertures are filled with solidified casting material, which results in the casting material outside the circumferential wall being connected and contiguous with the casting material inside the circumferential wall in the cavity, i.e. inside the circumferential wall. The casting material in the mesh apertures forms "bridges" between the casting material radially outside the circumferential wall, i.e. outside the cavity, and the casting material radially inside the circumferential wall, i.e. in the cavity. Upon curing and solidification, when the casting material might shrink, the casting material is less likely to delaminate from the surface of the circumferential wall of the electrode, because the large number of "bridges" hold the casting material in place on both sides of the circumferential wall. The bridges thereby help avoid separation of the casting material from the low-voltage electrode and reduce the creation of gaps and voids between the casting material and the electrode.

The mesh of conductive wires provides for better conductivity than, for example, a mesh of non-conductive filaments that are coated with a conductive material. The electrical resistance of a solid conductive wire is generally lower than the resistance of a thin conductive coating. Also, a coating on a filament creates a further interface between two materials. These materials may have different coefficients of thermal expansion and may therefore tend to separate from each other when temperature varies.

A mesh electrode provides a higher degree of mechanical stability than, for example, elongated metal lamellae connected with each other at their respective one ends and free on their respective other ends, because the wires of the mesh are interconnected in all portions of the mesh and thus in particular can provide stable edges of the circumferential wall which don't deform easily when a viscous casting material flows around the low-voltage mesh electrode.

Also, a mesh of wires generally provides for a greater mechanical stability combined with a greater number of apertures per area than, for example, a conductive foil with a plurality of through openings. Mechanical stability is important during manufacturing, when the liquid casting material flows into the mold under pressure and can deform the low-voltage electrode. The greater density of apertures helps obtain a more even field distribution between the high-voltage electrode and the low-voltage electrode.

A large voltage difference can exist between the high-voltage electrode and the low-voltage electrode. A void in the area of the low-voltage electrode is therefore more likely to cause an electrical discharge than a void in some other areas of the bushing. Delamination and void formation in the casting material in the area of the low-voltage electrode are therefore even more important to avoid than in some other areas of the bushing. It is therefore desirable that the low-voltage electrode have a high number of apertures per unit area, in which apertures the casting material can form "bridges" between casting material on opposed sides of the low-voltage electrode.

Also, conductive wire meshes are commercially available off the shelf, easier and at lower cost than, for example, a machined or custom-made structure of lamellae, sheets, or films, making the sensored bushing of the present disclosure more economical to produce.

The present disclosure relates to bushings and voltage dividers for use in medium-voltage (MV) or high-voltage (HV) power distribution networks in which electrical power is distributed via HV/MV power cables, transformers, switchgears, substations etc. with currents of tens or hundreds of amperes and voltages of tens of kilovolts. The expression "medium voltage" or "MV" as used herein refers to AC voltages in the range of 1 kilovolt ("kV") to 72 kV, whereas the expression "high voltage" or "HV" refers to AC voltages of more than 72 kV. Medium voltage and high voltage are collectively referred to herein as "elevated voltage".

Bushings according to the present disclosure are useful for sensing a voltage in a power distribution network with high accuracy. In particular the integrated primary capacitor of the bushing is useful as an element in the high-voltage portion of a capacitive voltage divider. The integrated primary capacitor of bushings according to the present disclosure may be used as the only capacitor in the high-voltage portion of a capacitive voltage divider, e.g. as the only capacitor in a capacitive voltage divider which comprises a single capacitor in its high-voltage portion.

In certain embodiments, a bushing according to the present disclosure is connected electrically and mechanically to an element such as a separable connector or a cable conductor, wherein the element is on elevated voltage. A voltage divider is used to sense the elevated voltage of the element to a certain degree of precision, e.g. ±10% or ±5% or ±1% or ±0.5% precision. The voltage divider can comprise the primary capacitor of a bushing as described herein.

In certain of these embodiments the primary capacitor of the sensored bushing is mechanically and electrically connected to an element on elevated voltage, e.g. to a conductor of a separable connector, to which an MV/HV power cable is electrically connected. In these embodiments the voltage divider comprising the primary capacitor can sense the elevated voltage of the power cable.

As used herein, a high-voltage portion of a voltage divider is the electrical portion that is electrically arranged between a signal contact, at which a divided voltage can be picked up, and the elevated voltage which is to be sensed. Accordingly, the low-voltage portion of a voltage divider is the portion that is electrically arranged between that signal contact and electrical ground.

In a capacitive voltage divider, the high-voltage portion comprises one or more capacitors ("high-voltage capacitors"), and the low-voltage portion comprises one or more capacitors ("low-voltage capacitors"). The primary capacitor of the bushing according to the present disclosure is one of the high-voltage capacitors. Where the high-voltage portion comprises only one high-voltage capacitor, the primary capacitor of the bushing according to the present disclosure is this high-voltage capacitor.

In certain embodiments a bushing according to the present disclosure comprises one low-voltage capacitor, or a plurality of low-voltage capacitors. A low-voltage capacitor may be a discrete capacitor or an integrated capacitor. Sensored bushings comprising a discrete low-voltage capacitor may be more easily adapted to a desired dividing ratio or to a desired signal voltage by picking a discrete low-voltage capacitor of a suitable capacitance than sensored bushings comprising an integrated low-voltage capacitor.

The low-voltage capacitor(s) may, for example, be embedded in the casting material or attached to the body of the bushing. It may be advantageous for the bushing to comprise the low-voltage capacitor(s) because this may increase reliability of the voltage divider, since no error-prone external wire connection between the primary capacitor and the low-voltage capacitor(s) is required and the connection between the primary capacitor and the low-voltage capacitor(s) may be shorter and hence be less likely to pick up noise.

Therefore, in certain embodiments of the bushing the bushing further comprises at least one low-voltage capacitor, comprised in a low-voltage portion of the voltage divider and electrically connected in series to the primary capacitor.

In certain of these embodiments the at least one low-voltage capacitor is a discrete capacitor, such as a surface-mount capacitor, embedded in the casting material.

The term "integrated capacitor" is used in this disclosure as referring to a capacitor which is formed by structural elements of a larger entity or of which at least portions are formed by structural elements of a larger entity. An example of an integrated capacitor is a capacitor formed by two conductive traces on opposite sides of a printed circuit board. As stated above, "integrated capacitor" is expressly meant to not refer to discrete capacitors. As used herein, discrete capacitors are capacitors which exist independently from structural elements of a larger entity at some stage and can be commercially obtained individually and separately from other elements and separate from structural elements. An integrated capacitor can thus not be a discrete capacitor, and a discrete capacitor can not be an integrated capacitor.

A bushing according to the present disclosure may further comprise a circuit board, embedded in the casting material, wherein the at least one low-voltage capacitor is mounted on the circuit board. Mounting the low-voltage capacitor(s) on a circuit board generally provides reliable mechanical support for the low-voltage capacitor(s) and facilitates electrical connection of the low-voltage capacitor(s) to other electrical elements of the bushing. The circuit board may comprise conductive traces to facilitate electrical connections. The circuit board may be a printed circuit board (PCB).

The at least one low-voltage capacitor(s) may be arranged outside of the cavity. Arrangement outside the cavity makes the casting process easier and more reliable. Arrangement outside the cavity also helps avoid excessive electrical stress in the space between the high-voltage electrode and the low-voltage electrode. This can make the bushing more reliable. Also, the high-voltage electrode and the low-voltage electrode may be arranged closer to each other, resulting in a generally smaller sensored bushing.

A bushing according to the present disclosure has a bushing body comprising a solidified, electrically insulating casting material. In certain embodiments the bushing body is formed by the solidified, electrically insulating casting material.

The bushing body may form a substantial portion of the bushing, such as at least 30% of the volume of the bushing, or at least 50% of the volume of the bushing. The bushing body may be adapted to provide structural rigidity to the bushing. A thin layer or a coating is not considered a body of the bushing.

The casting material is an electrically insulating material. It is flowable, i.e. liquid or viscous, when manufacturing the body, so that during a casting process it can flow through the apertures of the mesh of conductive wires of the circumferential wall into the cavity, e.g. into an inter-electrode space between the low-voltage electrode and the bushing conductor.

The casting material can then be solidified, i.e. hardened. Its solidification results in a hard and rigid casting material and consequently in a rigid body of the bushing. The casting material may solidify, for example, by curing. Curing may be effected by drying at room temperature or in an oven, or it may be effected by exposing the casting material to radiation, such as ultraviolet radiation or electron beam radiation. The casting material may contain a curing agent.

In certain embodiments the casting material is flowable at temperatures of 20° C. or more. Such casting materials may, for example, solidify by evaporation of its constituents or it may solidify, for example, by a forced curing process, such as UV curing or electron beam curing. In certain other embodiments the casting material may be flowable at temperatures of 80° C. or more, or 100° C. or more Such casting materials may, for example, solidify by cooling to a lower temperature, e.g. to temperatures of 30° C. or lower.

In certain advantageous embodiments the space between the low-voltage electrode and the high-voltage electrode, i.e. the "inter-electrode space", is completely filled with solidified casting material. In certain embodiments the cavity is completely filled with solidified casting material. The complete fill helps provide better mechanical stability of the circumferential wall and avoids the existence of unfilled pockets, gaps or voids through which partial discharges could occur.

In other embodiments, the cavity is partially filled with solidified casting material. In some of those other embodiments, the cavity is filled with solidified casting material and one or more other materials. In these embodiments, the solidified casting material and the one or more other materials may be each operable as a dielectric of the primary capacitor or they may be jointly operable as a dielectric of the primary capacitor.

The casting material may be, or may comprise, an epoxy resin or a polyurethane resin. The casting material may be a mixture of a resin material with one or more filler materials. Filler materials may be, for example, $SiO_2$ or $Al_2O_3$ or a ceramic material.

Before it solidifies, the casting material is in a liquid or viscous state, so that it can flow through the apertures formed by the mesh of conductive wires into the cavity within a time frame that is reasonable for an industrial production process, e.g. a few seconds up to a minute or several minutes. Viscosity of a casting material may depend on its temperature. For an industrial production process, it is advisable to select a casting material that has a sufficiently low viscosity to be flowable at an operating temperature of the casting process. An operating temperature of a suitable casting process for casting the body of the sensored bushing may be, for example, about 25° C. or about 50° C. or about 100° C. or about 130° C.

Where the mesh of conductive wires of the circumferential wall forms comparatively small apertures, the flowability of the casting material must be generally higher for it to flow into the cavity and its viscosity lower, whereas a higher-viscosity casting material may flow through apertures in a reasonable time if these apertures are larger. Viscosities above about 20,000 mPa·s at 20° C. appear generally not suitable for the casting material during an industrial casting process.

After solidifying, i.e. after curing or hardening, the casting material typically imparts its mechanical properties to the body of the bushing. In order to protect the low-voltage electrode and the bushing conductor embedded in the casting material against mechanical stress, it is desirable that the body be rigid. Hence the solidified casting material may be a solid, rigid material.

The low-voltage electrode of the primary capacitor is electrically connected to the low-voltage portion of the voltage divider. It is therefore on a lower voltage than the high-voltage electrode, which is a section of the bushing conductor which is on the elevated voltage that is to be measured. In certain embodiments, the low-voltage electrode is electrically connected to a low-voltage capacitor.

The conductive wires of the mesh of the circumferential wall may be made of metal, such as, for example, steel, copper, aluminium, gold, or silver. The thickness of the mesh may be, for example, between about 0.1 mm and about 5 mm, preferably between about 0.2 mm and about 2 mm. Thicker meshes may be harder to bring into the desired shape and may add to weight of the bushing more than necessary. The apertures are arranged in the mesh such as to form through-holes through the thickness of the mesh. Wires forming the mesh may have diameters, for example, of 0.05 mm or more, 0.2 mm or more, 0.5 mm or more, 1.0 mm or more and up to a few millimeters.

The low-voltage electrode and/or the circumferential wall may have a generally cylindrical shape. The inner diameter of the cavity formed by the circumferential wall is adapted such that the high-voltage electrode, i.e. the bushing conductor, can extend through the length of the cavity and such that in a concentric arrangement of the low-voltage electrode and the high-voltage electrode the radial distance between the inner surface of the low-voltage electrode and the outer surface of the high-voltage electrode is large enough to prevent electrical discharges between the electrodes through the casting material.

The inner diameter of the circumferential wall is advantageously chosen such that it can accommodate the portion of the bushing conductor which it surrounds, and such that the primary capacitor has a larger capacitance. Generally, the capacitance is larger if the distance between the electrodes is smaller. Too small a distance will, however, increase the risk of discharges through the dielectric, i.e. through the solidified casting material. The inner diameter of the circumferential wall will also depend on the peak value of the elevated voltage. In certain typical advantageous embodiments, the inner diameter of the circumferential wall is between 10 millimeters and 80 millimeters. Correspondingly, in certain embodiments, the diameter of the cavity is between 10 millimeters and 80 millimeters.

In certain advantageous embodiments the circumferential wall has a generally cylindrical shape, and also the bushing conductor surrounded by the circumferential wall has a generally cylindrical shape. In some of those embodiments the circumferential wall is arranged concentrically around the bushing conductor. A concentric arrangement can provide for an even distance between the electrodes, which helps avoid electrically weak areas with higher electrical stress where electrical discharges are more likely to occur. This, in turn, may allow for a smaller overall size of the sensored bushing and enhanced reliability.

Therefore, in certain embodiments, the circumferential wall has a generally cylindrical shape, and the high-voltage electrode has a generally cylindrical shape, and the circumferential wall is arranged concentrically around at least a portion of the high-voltage electrode.

In concentric electrode arrangements, electrical stress is more evenly distributed around the circumference of the respective electrodes. Due to this even distribution, the electrodes can be operated at a smaller overall distance between each other, which will often allow for a smaller overall size of the sensored bushing and/or a higher capacitance of the primary capacitor. The flow of casting material through the apertures into the cavity may reduce the number of voids in the body of the sensored bushing, and thereby may allow for higher field strengths without creating an unacceptably high risk of discharges. Depending on, inter alia, the elevated voltage and the electrical properties of the casting material, the radial distance between the circumferential wall of the low-voltage electrode and the high-voltage electrode may be 50 millimeters or less, or even 20 millimeters or 15 millimeters or less, while in typical embodiments this distance is between 1 millimeter and 10 millimeters. This radial distance is measured in a direction orthogonal to the central axis of the concentric arrangement and between the outer surface of the high-voltage electrode (i.e. of the portion of the bushing conductor surrounded by the circumferential wall) and the inner surface of the circumferential wall. Hence in certain embodiments a radial distance between the circumferential wall and the high-voltage electrode is 50 millimeters or less.

Independent of its cross section, the circumferential wall extends circumferentially generally about a full 360° circumference, so that the cavity is delimited by the circumferential wall at all points of the circumference, except for where the apertures of the mesh are located.

It is desirable to keep the spatial relationship between the bushing conductor and the circumferential wall stable during the casting process when the casting material flows into the cavity, possibly with some pressure that may tend to deform the circumferential wall. Therefore, in certain embodiments, a sensored bushing according to the present disclosure further comprises a spacer for maintaining the circumferential wall in a fixed position, in particular in a fixed radial position, relative to the bushing conductor or relative to the body of the bushing.

The circumferential wall may not have a cylindrical shape but may have the shape of a funnel. A funnel shape of the circumferential wall may be a funnel shape formed by a plurality of flat segments. The cross section of such a funnel-shaped circumferential wall may resemble, for example, a circle or an ellipse, a polygon, such as an octagon or a hexagon, a rectangle, a square or a triangle.

The circumferential wall of the low-voltage electrode forms a cavity. The cavity is thus delimited by the circumferential wall. The cavity may be elongated and may thereby define length directions. The cavity may be axially symmetric about a symmetry axis, whereby the symmetry axis may define length directions. Radial directions are directions perpendicular to a length direction. The cavity may comprise a first end portion and a second end portion, the first and the second end portions being opposed to each other in length direction.

The cavity is delimited radially by the circumferential wall. Hence the shape of the circumferential wall determines the shape of the cavity. The cross section of the cavity may have the shape, for example, of a polygon, such as an octagon or a hexagon, a rectangle, of a square or even a triangle. Alternatively, the cavity may have, for example, a cylindrical shape. Alternatively, the cross section of the cavity may have the shape of a circle or of an ellipsis, or it may have an oval shape.

In a specific embodiment, the circumferential wall has a cylindrical shape and forms a cylindrical cavity which is open at the first and at the second end portion.

The diameter of the cavity may vary along its length direction. Hence the cavity may have, for example, the shape of a funnel. The cross section of a funnel-shaped cavity may have the shape of a polygon, such as an octagon or a hexagon, a rectangle, a square or even a triangle. Alternatively, the cavity may have, for example, a conical shape. Alternatively, the cross section of the funnel-shaped cavity may have the shape of a circle or of an ellipsis, or it may have an oval shape, or it may have an irregular shape.

The circumferential wall may be shaped such as to form a cavity that is axially symmetric about an axis which is parallel to its length direction. Alternatively, however, the cavity may not be axially symmetric. In certain embodiments, the cavity is not straight in its general length direction, but it is curved in its general length direction.

Both the low-voltage electrode and the high-voltage electrode of the primary capacitor are embedded in the casting material forming the bushing body. In particular, the mesh of conductive wires of the circumferential wall of the low-voltage electrode is embedded in the casting material. As used herein, an element is "embedded" in a material if it is surrounded on all sides by that material.

A portion of the low-voltage electrode, such as the mesh of conductive wires of the circumferential wall, may be in surface contact with a portion of the solidified casting material. The conductive wires of the mesh of conductive wires of the circumferential wall may be in surface contact with the solidified casting material.

Where the circumferential wall has a cylindrical shape, its outer curved surface (i.e. its surface facing away from the cavity) may be in surface contact with the solidified casting material of the bushing body. In addition, or alternatively, the inner curved surface of the circumferential wall (i.e. its surface facing towards the cavity) may be in surface contact with the solidified casting material It may be advantageous to shield the low-voltage electrode from external electric or magnetic fields. For that purpose, a shield electrode can be arranged around the circumferential wall. The shield electrode can be electrically connected to ground or to a fixed voltage. The shield electrode may be formed, for example, by a conductive coating on an outer surface of the bushing body. Preferably, however, the shield electrode is embedded in the casting material of the bushing body. To help avoid delamination of the casting material from the shield electrode, the shield electrode may be provided with apertures through which the casting material can flow, and in which casting material can be arranged to help form "bridges" between casting material radially outside the shield electrode and casting material radially inside the shield electrode. In preferred embodiments the shield electrode is, or comprises, a mesh of conductive wires as described herein for the circumferential wall of the low-voltage electrode. The mesh of conductive wires may form a plurality of apertures between the conductive wires to allow the casting material radially outside the shield electrode to be mechanically connected with the casting material radially inside the shield electrode. In certain other embodiments the shield electrode is, or comprises, a conductive metal sheet having apertures or through-holes. Alternatively, the shield electrode may not have apertures at all.

The shield electrode preferably has a generally cylindrical shape. To obtain a desired shielding effect the shield electrode surrounds the low-voltage electrode and/or surrounds the circumferential wall of the low-voltage electrode.

Where the shield electrode has a cylindrical shape, it may be arranged coaxially with the bushing conductor. Where the circumferential wall has a generally cylindrical shape, and where the high-voltage electrode has a generally cylindrical shape, and where the circumferential wall is arranged concentrically around at least a portion of the high-voltage electrode, the shield electrode may be arranged coaxially with the circumferential wall and with the high-voltage electrode. Such an arrangement may help obtain an even field distribution in the bushing and may be simpler to design and manufacture.

Hence in certain embodiments the sensored bushing further comprises a shield electrode embedded in the casting material, the shield electrode having a cylindrical shape and surrounding the circumferential wall, wherein optionally the shield electrode comprises a mesh of conductive wires forming a plurality of apertures between the conductive wires to allow the casting material radially outside the shield electrode to be mechanically connected with the casting material radially inside the shield electrode.

Turning now to the high-voltage electrode of the primary capacitor, this electrode is a section of the bushing conductor, i.e. a longitudinal section of the bushing conductor. The high-voltage electrode extends lengthwise through the cavity formed by the circumferential wall. It is thereby surrounded by the circumferential wall. The high-voltage electrode may be the longitudinal section of the bushing conductor which is surrounded by the low-voltage electrode.

The high-voltage electrode of the primary capacitor is on the elevated AC voltage, while the low-voltage electrode is generally on a considerably lower voltage, so that parasitic currents flow through the casting material between the electrodes. These parasitic currents can be described by "parasitic capacitances". In typical sensored bushings for elevated voltages of about 50 kV, these parasitic capacitances are typically between 1 and 10 pF (picofarad), varying generally with the temperature of the casting material. For precise voltage measurement, the capacitance of the primary capacitor—or generally of the high-voltage portion of the voltage divider—should be clearly greater than these 1-10 pF, so that the signal voltage is not influenced greatly by variations of the parasitic capacitances. A capacitance of the primary capacitor which is larger than 10 pF is therefore desirable. Also, the voltage divider is usually connected to a voltage measurement device which senses the divided voltage and determines the elevated voltage from the divided voltage. A higher capacitance of the primary capacitor is desirable in order to reduce the influence of the input impedance of the voltage measurement device and to thereby provide for a higher accuracy in sensing the elevated voltage.

Sensored bushings according to the present disclosure are received in an access receptacle in a separable connector by which a power cable can be connected, via the bushing, to a switchgear or a transformer in a power distribution network, e.g. a national grid. Sensored bushings described herein have a shape that corresponds to the shape of the receptacle in which it is supposed to be received. Often, the receptacle and the bushing have a shape of a truncated cone.

In certain embodiments the sensored bushing of the present disclosure is adapted such that the high-voltage electrode can be electrically connected to an element of the separable connector on elevated voltage.

In bushings according to the present disclosure the shape of the apertures formed by the mesh of conductive wires of the circumferential wall is not particularly limited. An aperture, or a plurality of apertures, or all apertures may have a circular shape, an elliptical, an oval, a square, a rectangular, a hexagonal, a polygonal, a triangular or a diamond shape, for example.

A more viscous casting material will generally require larger apertures to flow reliably through the apertures into the cavity. Hence the size of a larger number of apertures is advantageously chosen such that the combination of aperture size and viscosity allows for a flow of the casting material to reliably fill the cavity completely within an acceptable time.

A portion of the casting material advantageously fills each aperture, or at least a plurality of apertures, and thereby mechanically connects, through the apertures, casting material outside, i.e. radially outside, the circumferential wall with casting material in the cavity, i.e. inside, i.e. radially inside, the circumferential wall. This mechanical connection generally helps reduce the risk of gaps or voids or delamination being created upon thermal cycling or upon potential shrinkage of the casting material during solidification or thereafter. Larger apertures generally improve the connection between the portion of the casting material outside the circumferential wall and the portion of the casting material inside the circumferential wall, where a better connection reduces the risk of delamination between the portions during solidification and curing of the casting material.

Hence in certain embodiments each aperture of the plurality of apertures is filled with a portion of the casting material.

For viscosities of the casting material of less than 20,000 mPa·s at 60° C., the size of the apertures may advantageously be chosen to be at least about 0.1 mm in their shortest extensions. In certain embodiments the size of the apertures is greater than 0.5 mm, or greater than 1 mm, in their shortest extension. The extension of an aperture as used herein is measured along the surface of the mesh of conductive wires, not in the thickness direction of the mesh, i.e. not orthogonal to the surface of the mesh.

Within the limits outlined above, it is generally preferred for the circumferential wall to have more smaller apertures, as opposed to fewer larger apertures. Taking into account typical sizes and distances for components exposed to high and medium voltages, in certain embodiments of a sensored bushing according to the present disclosure, each aperture of the plurality of apertures has a longest extension of five millimeters or less.

Besides the size of the apertures it is also the number of apertures in the mesh of conductive wires which determines how reliably the casting material can flow into the cavity, and how well the portion of the casting material outside the circumferential wall is connected with the portion of the casting material inside the cavity. Hence more apertures are desirable but a greater number of apertures of the same size reduces the surface of the low-voltage electrode which typically reduces the capacitance of the primary capacitor, increases field strength at the edges of the apertures and weakens the structure of the circumferential wall of the low-voltage electrode.

In certain embodiments, the plurality of apertures comprises at least one hundred apertures or at least one thousand apertures or at least ten thousand apertures. Depending on the choice of viscosity of the casting material and the size of the apertures, one hundred apertures is deemed to be a typical minimum number of apertures for ensuring adequate contact between casting material outside the circumferential wall and casting material inside the cavity. In certain other embodiments, however, the plurality of apertures comprises ten or more apertures, or fifty or more apertures.

In balancing these requirements, a few tens, or a few hundreds or a few thousands of apertures may be an desirable choice for sensored bushings according to this disclosure in which the cavity has, for example, a length of between 2 cm and 10 cm and a diameter of between 1 cm and 10 cm.

The apertures may generally be positioned randomly in the circumferential wall. However, in order to provide for a good coherence between portions of the casting material outside the circumferential wall and portions of the casting material inside the circumferential wall in all parts of the circumferential wall, in certain preferred embodiments the apertures between the conductive wires of the mesh are evenly distributed over the mesh of conductive wires of the circumferential wall. An even distribution relates to approximately the same number of apertures per unit area of the circumferential wall. Preferably the apertures form a regular, repetitive pattern of identically-sized apertures. Preferably they form a regular, repetitive pattern of identically-sized and identically-spaced apertures. Identically-spaced apertures help obtain a greater accuracy of the capacitance of the primary capacitor and hence of the voltage measurement, and they are easier to simulate in electrical simulation software when designing bushings according to the present disclosure, resulting in lower cost and less variability in production.

Hence in certain embodiments the plurality of apertures forms a regular repetitive pattern of identically-sized apertures. In certain of these embodiments the plurality of apertures forms a regular repetitive pattern of identically-sized and identically-spaced apertures.

Too many large apertures may weaken the circumferential wall and reduce the capacitance of the primary capacitor. It is conceived that in certain advantageous embodiments the apertures account for less than about 80% of the continuous surface of the mesh of conductive wires of the circumferential wall. "Continuous surface" refers to the imaginary surface of the mesh if no apertures were present. In other advantageous embodiments the apertures account for less than about 50% of the continuous surface of the mesh, in certain other embodiments the apertures account for less than about 30% of the continuous surface of the mesh.

The sensored bushings disclosed herein can be used in electrical apparatus such as switchgears or transformers to sense elevated voltages at an input or an output of the apparatus. The present disclosure therefore also provides an electrical apparatus, such as a switchgear or a transformer, for distributing electrical power in a medium-voltage or high-voltage power distribution network, having a) a current conductor for conducting the electrical power, the current conductor being on elevated voltage when in use; and b) a bushing as described herein, wherein the high-voltage electrode of the bushing is electrically connected to the current conductor.

The bushings disclosed herein can be manufactured cost-effectively and are useful for reliably sensing voltages in MV/HV power distribution networks. Voltage sensors are preferably placed in electrical apparatus of the network, such as in switchgears or in transformers. The primary capacitor of the sensored bushing can be connected electrically to a current conductor on elevated voltage of such apparatus to sense the voltage of the current conductor, e.g. versus ground or versus another phase. Therefore, the present disclosure also provides a power distribution network for distributing electrical power at medium or high voltages, the network comprising an electrical apparatus, such as a switchgear or a transformer, as described in the preceding paragraph.

The present disclosure also provides a process for making a sensored bushing as described herein. In an exemplary manufacturing process, the low-voltage electrode and the high-voltage electrode as described above are provided and the high-voltage electrode, i.e. at least a portion of the bushing conductor, is arranged in the cavity formed by the circumferential wall of the low-voltage electrode. These electrodes form the electrodes of an integrated primary capacitor for a high-voltage portion of a voltage divider for sensing an elevated voltage of the bushing conductor.

Subsequently, the body of the bushing is formed in a casting process, and the low-voltage electrode and the high-voltage electrode are embedded in the flowable, yet uncured casting material of the bushing body. In this casting process, viscous or liquid casting material flows into the cavity through the apertures of the mesh of conductive wires of the circumferential wall, as described above. Thereafter the casting material solidifies to form at least a portion of the bushing body. A portion of the solidified casting material, between its low-voltage electrode and its high-voltage electrode, forms a dielectric of the primary capacitor. Due to the apertures in the circumferential wall, this process yields a sensored bushing in a quick and hence cost-effective way, in which the dielectric is less likely to contain gaps or voids, and the solidified casting material is less likely to delaminate from the circumferential wall and create gaps between the low-voltage electrode and the dielectric of the primary capacitor.

Hence the present disclosure further provides a process of making a bushing as described herein, comprising the steps, in this sequence, of a) providing a low-voltage electrode comprising a circumferential wall forming a cavity, the circumferential wall comprising a mesh of conductive wires forming plurality of apertures between the conductive wires to allow a casting material radially outside the circumferential wall to be mechanically connected with the casting material in the cavity; and b) embed the low-voltage electrode in an electrically insulating flowable, solidifiable casting material by making a portion of the casting material flow into the cavity through the apertures; and c) solidify the casting material to form a body of the bushing.

BRIEF DESCRIPTION OF THE FIGURES

The sensored bushing according to the present disclosure will now be described in more detail with reference to the following Figures exemplifying particular embodiments.

DETAILED DESCRIPTION

Figure 1:
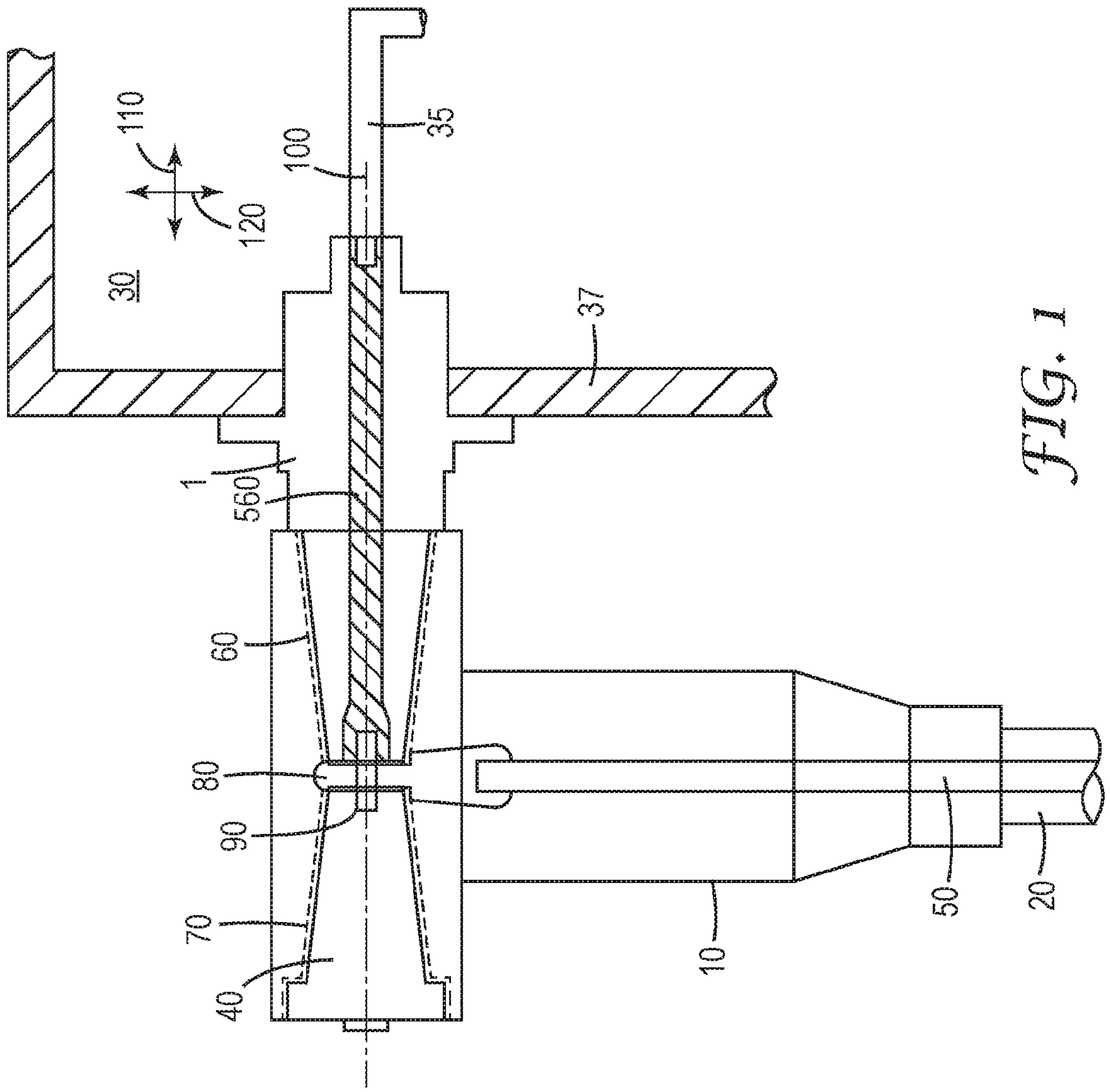
FIG. 1 Sectional view of a separable connector and a first sensored bushing according to the present disclosure.

The sectional view of FIG. 1 illustrates a separable connector 10 and a first sensored bushing 1 according to the present disclosure. The separable connector 10 is arranged at an end of a medium-voltage power cable 20 and connects, via the bushing 1, the power-carrying central conductor 50 of the cable 20 to a medium-voltage switchgear 30 in a power distribution network of a national grid.

The separable connector 10 is a T-shaped separable connector 10 and comprises a front cavity 60 for receiving a portion of the bushing 1, and a rear cavity 70 for receiving an insulation plug 40 of a matching shape. The insulation plug 40 serves to electrically insulate a connection element 80 of the separable connector 10, which is electrically connected to the central conductor 50 of the cable 20 and can be electrically and mechanically connected to a bushing conductor 560 in the bushing 1 via a threaded stud 90. In use, the connection element 80 is on the elevated voltage of the central conductor 50 of the cable 20.

Bushings in general are components that lead power on high or medium voltage to a current conductor 35 of a network apparatus (e.g. of a switchgear 30 or of a transformer) through an opening in an outer wall 37 of the apparatus. For that purpose, a bushing comprises an elongated conductor ("bushing conductor") for conducting the power on elevated voltage, and an insulating body surrounding the bushing conductor.

The sensored bushing 1 according to the present disclosure, just like a traditional bushing, has an overall frustoconical protrusion and is generally rotationally symmetric about a bushing axis 100 which defines axial directions 110 and radial directions 120, which are directions orthogonal to the axial directions 110. The separable connector 10 can be engaged with the bushing 1 by moving it axially in an axial direction 110 towards and over the frustoconical protruding portion of the bushing 1 and by threading the conductive stud 90 into a threaded bore in the bushing conductor 560. Thereby the bushing conductor 560 is electrically connected-via the connection element 80—with the central conductor 50 of the cable 20 on elevated voltage. The geometry of the sensored bushing 1 is adapted to conform to ANSI/IEEE standard 386.

The sensored bushing 1 comprises an integrated primary capacitor, which can be electrically connected, via the bushing conductor 560, to the connection element 80 on elevated voltage and which is operable as a high-voltage capacitor in a voltage divider for sensing the elevated voltage, as will be explained in the context of the other Figures.

Figure 2:
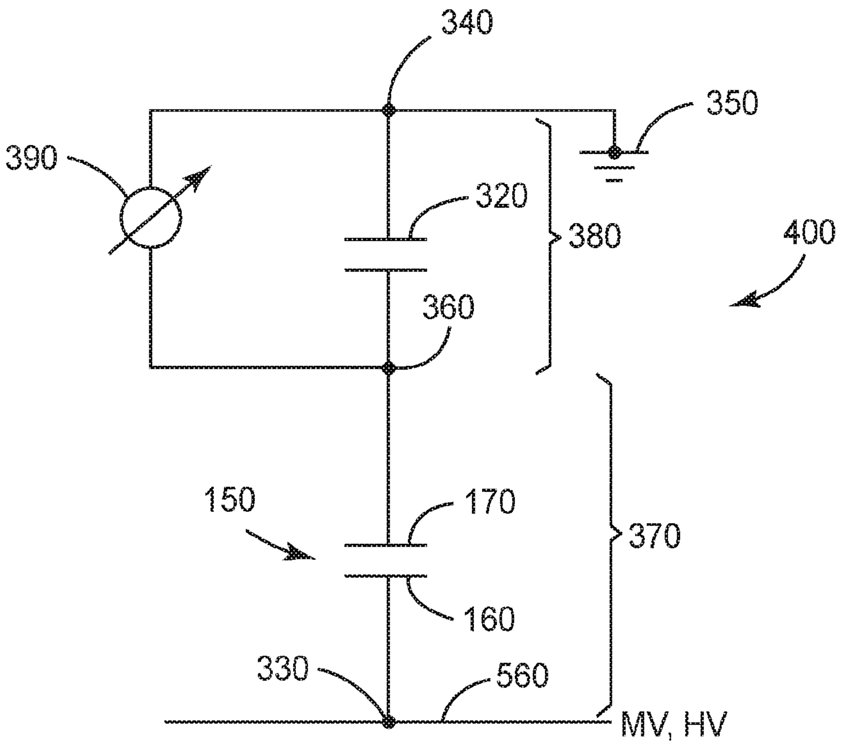
FIG. 2 Circuit diagram of a voltage divider comprising a primary capacitor of a sensored bushing according to the present disclosure.

FIG. 2 is a circuit diagram of a voltage divider 400 for sensing the elevated voltage of the bushing conductor 560 of the bushing 1 of the present disclosure.

The voltage divider 400 for sensing the elevated voltage of the bushing conductor 560 is shown electrically connected to the bushing conductor 560 on medium or high (i.e. elevated) voltage at a high-voltage contact 330. The voltage divider 400 comprises a high-voltage capacitor 150, corresponding to the primary capacitor 150 in the sensored bushing 1 described below, and a low-voltage capacitor 320. These two capacitors are electrically connected in series between the elevated voltage of the bushing conductor 560 and a low-voltage contact 340, held on electrical ground 350. The low-voltage contact 340 facilitates connection of the voltage divider 400 to electrical ground 350.

A signal contact 360 is arranged electrically between a high-voltage portion 370 and a low-voltage portion 380 of the voltage divider 400. At the signal contact 360, a divided voltage, also referred to herein as the signal voltage, can be picked up, which varies proportionally with the elevated voltage of the bushing conductor 560. The dividing ratio, i.e. the proportionality factor between the elevated voltage and the signal voltage, depends on the ratio of the total impedance of the high-voltage portion 370 to the total impedance of the low-voltage portion 380 of the voltage divider 400. By measuring the signal voltage of the signal contact 360 using a voltmeter 390 and applying the proportionality factor, the elevated voltage of the bushing conductor 560 can be sensed.

In the illustrated embodiment, the high-voltage portion 370 comprises only one capacitor, namely the primary capacitor 150, with its high-voltage electrode 160 and its low-voltage electrode 170. In other embodiments the high-voltage portion 370 may comprise, beyond the primary capacitor 150, one or more further capacitors. It may comprise, beyond the primary capacitor 150, one or more further impedance elements, such as one or more resistors and/or one or more inductors.

Similarly, in the illustrated voltage divider 400, the low-voltage portion 380 comprises only one capacitor, namely the low-voltage capacitor 320. In other embodiments the low-voltage portion 380 may comprise, beyond the low-voltage capacitor 320, one or more further capacitors. It may comprise, beyond the low-voltage capacitor 320, one or more further impedance elements, such as one or more resistors and/or one or more inductors.

Figure 3:
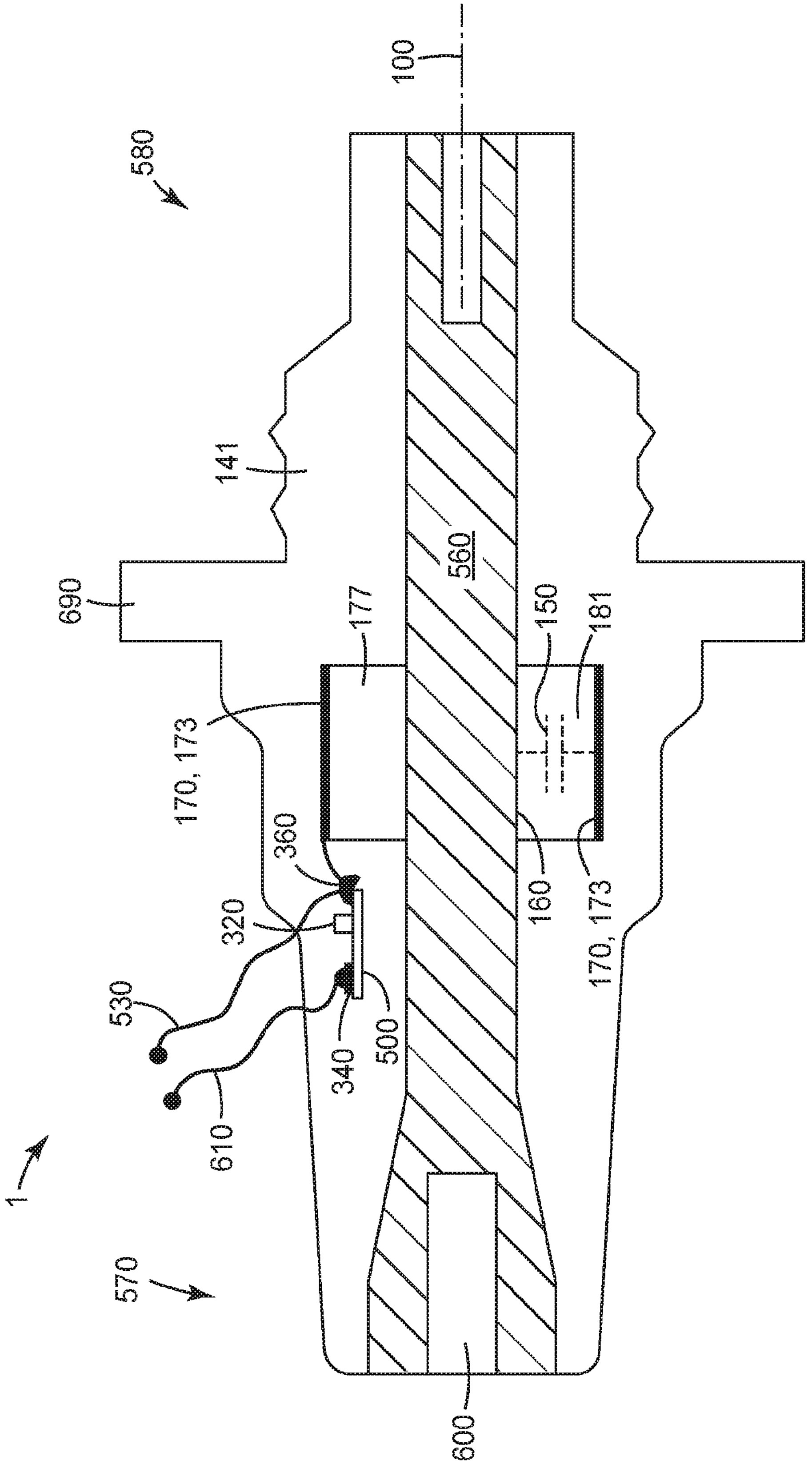
FIG. 3 Sectional view of the first sensored bushing.

FIG. 3 is a sectional view of the first bushing 1 showing more details, like, for example, electrodes of a primary capacitor 150, a circuit board 500 and a low-voltage capacitor 320. The first bushing 1 is thus a "sensored bushing".

The sensored bushing 1 comprises an insulating bushing body 141 of an electrically insulating hardened resin and surrounds the elongated bushing conductor 560 to electrically insulate the bushing conductor 560. The bushing 1 has a connector end portion 570 for electrical and mechanical connection to a separable connector 10, and an apparatus end portion 580 for electrical and mechanical connection to the apparatus 30. The bushing 1 is mounted in an opening of a wall of the apparatus 30 at a flange 690. The connector end portion 570 has a frusto-conical shape to fit into a front cavity 60 of a separable connector 10 of corresponding shape. A threaded bore 600 in the bushing conductor 560 can engage with a threaded stud 90 as shown in FIG. 1, so that the bushing conductor 560 is conductively connected, via the stud 90 and the connection element 80 of the separable connector 10, with the conductor 50 of the power cable 20.

The bushing body 141 and the bushing conductor 560 are generally rotationally symmetric about an axis 100. The axis 100 defines length or axial directions 110 of the bushing 1. Radial directions 120 are directions orthogonal to the axis 100.

A primary capacitor 150 is formed by a high-voltage electrode 160 (which is the bushing conductor 560) and a low-voltage electrode 170. The low-voltage electrode 170 is rotationally symmetric about the bushing axis 100 and has a generally tubular shape, defined by a circumferential wall 173. The circumferential wall 173 is arranged concentrically with the bushing conductor 560 and surrounds the bushing conductor 560 completely, i.e. over a full 360° angle. The circumferential wall 173 is elongated in length direction 110 and forms a cavity 177, which is the space radially between the circumferential wall 173 and bushing conductor 560. The dielectric of the primary capacitor 150 is formed by a portion 181 of the insulating casting material of the bushing body 141, located between the high-voltage electrode 160 and the low-voltage electrode 170.

The circumferential wall 173 comprises a mesh of conductive wires forming a plurality of apertures between the wires. The apertures allow the casting material radially outside the circumferential wall 173 to be mechanically connected with the casting material in the cavity 177 while the casting material solidifies and thereafter.

The low-voltage electrode 170 is completely surrounded by the insulating material of the bushing body 141, in other words it is embedded in the bushing body 141.

The insulation material of the bushing body 141 is a hardened epoxy resin. In manufacturing, the resin in its liquid state is cast or molded around the high-voltage electrode 160 and the low-voltage electrode 170, in a mold that determines the outer shape of the bushing 1. The resin is then cured or hardened to solidify, resulting in a solid insulating bushing body 141 in which the low-voltage electrode 170 and the high-voltage electrode 160 of the primary capacitor 150 are embedded. The electrical breakdown strength of the insulating material is high enough to reliably prevent electric discharges between the high-voltage electrode 160 (i.e. the bushing conductor 560) on elevated voltage and the low-voltage electrode 170.

The primary capacitor 150 of the sensored bushing 1 forms the high-voltage portion 370 of a capacitive voltage divider 400 according to FIG. 2. A low-voltage capacitor 320 forming the low-voltage portion 380 of this voltage divider 400 may be arranged inside the bushing body 141 or outside the bushing body 141.

In the embodiment of FIG. 3, a low-voltage capacitor 320 of the voltage divider 400 is arranged on a surface of a circuit board 500 embedded in the bushing body 141. This low-voltage capacitor 320 is electrically connected in series between the low-voltage electrode 170 and a grounding contact 340 held on electrical ground 350 via grounding wire 610 leading to outside the bushing 1. The grounding contact 340 in FIG. 3 corresponds to the low-voltage contact 340 of the voltage divider 400 in FIG. 2.

The low-voltage capacitor 320 forms the low-voltage portion 380 of the voltage divider 400 for sensing the elevated voltage of the bushing conductor 560, with the primary capacitor 150 forming the high-voltage portion 370 of the voltage divider 400.

The divided voltage of the voltage divider 400 can be accessed at a signal contact 360 on the circuit board 500. A signal wire 530 makes the signal voltage available outside the bushing 1. As is generally known for voltage dividers, the signal voltage varies proportionally with the elevated voltage of the high-voltage electrode 160, so that the elevated voltage of the high-voltage electrode 160—and thereby the elevated voltage of the bushing conductor 560 of the sensored bushing 1—can be sensed by measuring the signal voltage and multiplying it with the dividing ratio of the voltage divider 400 as explained above.

Figure 4:
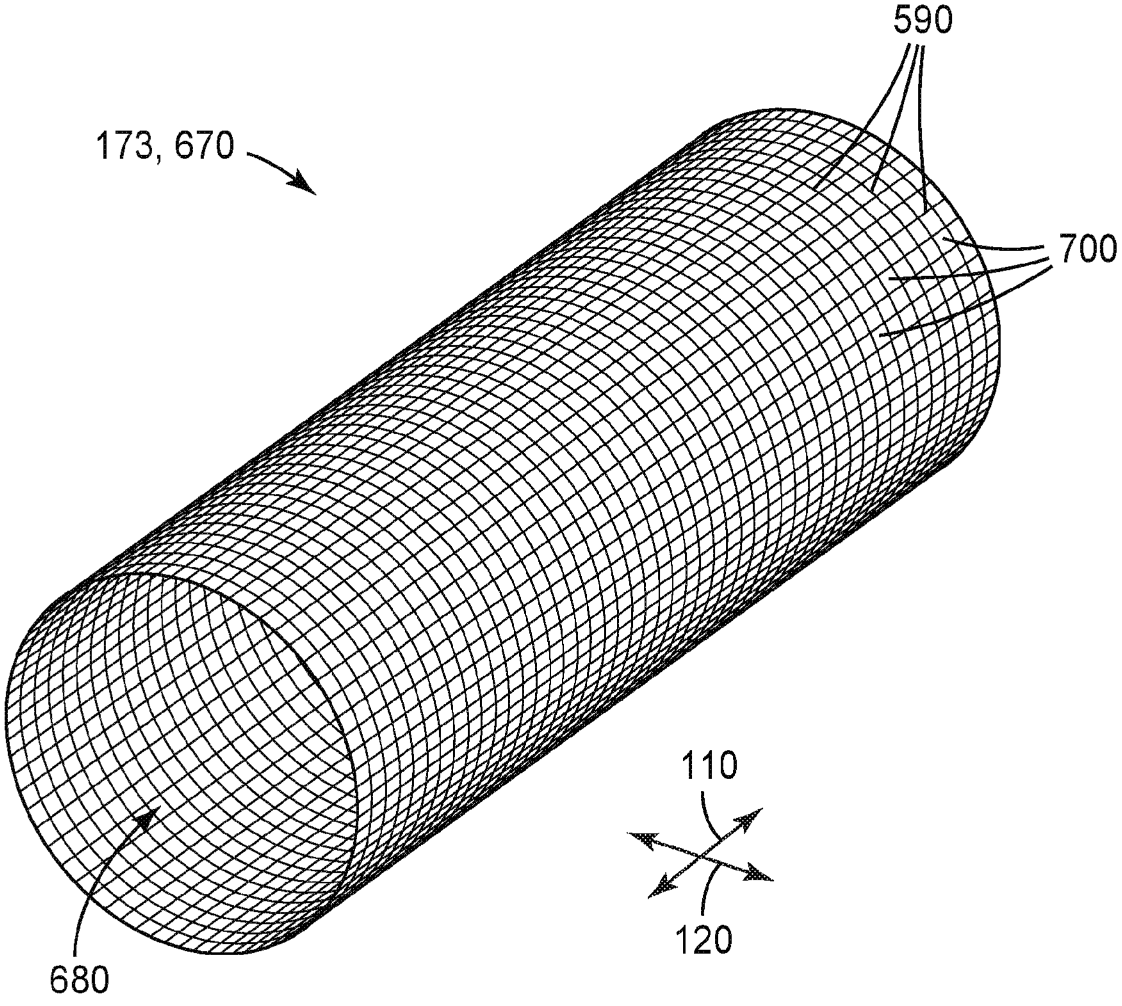
FIG. 4 Perspective view of a circumferential wall of a second sensored bushing according to the present disclosure.

FIG. 4 is a perspective view of the circumferential wall 173 of a low-voltage electrode 170 of the primary capacitor 150 of a second sensored bushing according to the present disclosure (not shown). The circumferential wall 173 is longer in axial directions 110 than the circumferential wall 173 of the low-voltage electrode 170 of the first sensored bushing 1 of FIG. 3, but otherwise identical. The circumferential wall 173 is a mesh 670 of crossed conductive wires 590. The mesh 670 is of a tubular shape, the "tube" shape defining an interior space 680 of the circumferential wall 173. The interior space 680 is the space inside, i.e. radially inward from, the mesh 670. When the sensored bushing 1 is assembled, the interior space 680 receives the high-voltage electrode 160 (i.e. a section of the bushing conductor 560), so that the mesh 670 of the low-voltage electrode 170 is arranged around the high-voltage electrode 160 and so that the circumferential wall 173 surrounds the bushing conductor 560. Once casting material is cast or molded around the low-voltage electrode 170 and the high-voltage electrode 160 to form the bushing body 141, the low-voltage electrode 170 is embedded in the bushing body 141.

In the embodiment of FIG. 4, the wires 590 have a diameter of 0.2 mm and are of a stainless steel material. They are spaced appropriately to form a plurality of apertures 700 between the wires 590, extending in a thickness direction of the mesh 670. These apertures 700 allow portions of the insulating material on opposite sides of the mesh 670, i.e. portions radially inside the mesh 670 in the interior space 680 and portions outside the mesh 670, to be mechanically connected with each other by insulating material in the apertures 700. This mechanical connection through the apertures 700 results in the insulating material extending through the apertures 700. Insulating material in the apertures 700 holds insulating material radially inward from the mesh 670 in mechanical connection, and contiguous, with insulating material radially outward of the mesh 670 during and after solidification of the insulating material. This mechanical connection reduces the risk of delamination of the insulating material at the mesh 670 and of mechanical separation, i.e. delamination, of the inward portion from the outward portion of the insulating material.

The mesh 670 shown in FIG. 4 comprises wires 590 extending in length direction 110 of the circumferential wall 173 and wires 590 extending in circumferential direction of the circumferential wall 173, crossing each other at a 90° angle. It is contemplated that other mesh geometries may be used for a mesh 670 usable as a low-voltage electrode 170 of a sensored bushing 1 as described herein. Wires of a mesh may, for example, cross at other angles, wires may extend in more than two directions, wires may be woven or knotted, spacing between adjacent wires may vary, wires of different diameters may be used in one deformable mesh, etc. Such geometries—as well as different materials and diameters of the wires—may be usable in a sensored bushing 1 described herein, provided that the resulting mesh 670 comprises apertures 700 suitable for allowing portions of the insulating material on opposite sides of the mesh 670 to be mechanically connected with each other by insulating material in the apertures 700.

The invention claimed is:

1. Bushing for connecting a separable connector to a switchgear or to a transformer in a power distribution network of a national grid for distributing electrical power at medium or high voltages, the bushing comprising a) a bushing body comprising a solidified, electrically insulating casting material;

b) a bushing conductor, embedded in the casting material, for conducting power at medium or high voltages into the switchgear or the transformer, and c) an integrated primary capacitor, operable in a high-voltage portion of a voltage divider for sensing a voltage of the bushing conductor, wherein the primary capacitor comprises a low-voltage electrode, a high-voltage electrode and a dielectric;

wherein the high-voltage electrode is a section of the bushing conductor;

wherein the low-voltage electrode is embedded in the casting material and comprises a circumferential wall surrounding the bushing conductor and forming a cavity;

wherein the dielectric is formed by a portion of the casting material arranged in the cavity, and wherein the circumferential wall comprises a mesh of conductive wires forming a plurality of apertures between the conductive wires to allow the casting material radially outside the circumferential wall to be mechanically connected with the casting material in the cavity, wherein the bushing further comprises at least one low-voltage capacitor, comprised in a low-voltage portion of the voltage divider and electrically connected in series to the primary capacitor, wherein the at least one low-voltage capacitor comprises a discrete capacitor, embedded in the casting material.

2. Bushing according to claim 1, wherein the plurality of apertures forms a regular repetitive pattern of identically-sized apertures.

3. Bushing according to claim 1, wherein each aperture of the plurality of apertures has a longest extension of 5 millimeters or less.

4. Bushing according to claim 1, wherein each aperture of the plurality of apertures is filled with a portion of the casting material.

5. Bushing according to claim 1, wherein the circumferential wall has a generally cylindrical shape, wherein the high-voltage electrode has a generally cylindrical shape, and wherein the circumferential wall is arranged concentrically around at least a portion of the high-voltage electrode.

6. Bushing according to claim 1, further comprising a shield electrode embedded in the casting material, the shield electrode having a cylindrical shape and surrounding the circumferential wall, wherein optionally the shield electrode comprises a mesh of conductive wires forming a plurality of apertures between the conductive wires to allow the casting material radially outside the shield electrode to be mechanically connected with the casting material radially inside the shield electrode.

7. Bushing according to claim 1, wherein the diameter of the cavity is between 10 millimeters and 80 millimeters.

8. Bushing according to claim 1, further comprising at least one low-voltage capacitor, comprised in a low-voltage portion of the voltage divider and electrically connected in series to the primary capacitor.

9. Bushing according to claim 8, wherein the at least one low-voltage capacitor is a discrete capacitor, such as a surface-mount capacitor, embedded in the casting material.

10. Bushing according to claim 9, further comprising a circuit board, embedded in the casting material, wherein the at least one low-voltage capacitor is mounted on the circuit board.

11. Bushing according to claim 8, wherein the at least one low-voltage capacitor is arranged outside of the cavity.

12. Bushing according to claim 1, wherein the cavity is completely filled with solidified casting material.

13. Electrical apparatus, such as a switchgear or a transformer, for distributing electrical power in a medium-voltage or high-voltage power distribution network, having a) a current conductor for conducting the electrical power, the current conductor being on elevated voltage when in use; and b) a bushing according to claim 1, wherein the high-voltage electrode of the bushing is electrically connected to the current conductor.

14. Power distribution network for distributing electrical power at medium or high voltages, the network comprising an electrical apparatus according to claim 13.

15. Process of making a bushing according to claim 1, comprising the steps, in this sequence, of a) providing a low-voltage electrode comprising a circumferential wall forming a cavity, the circumferential wall comprising a mesh of conductive wires forming a plurality of apertures between the conductive wires to allow a casting material radially outside the circumferential wall to be mechanically connected with the casting material in the cavity;

b) embed the low-voltage electrode in an electrically insulating flowable, solidifiable casting material by making a portion of the casting material flow into the cavity through the apertures; and c) solidify the casting material to form a body of the bushing.

* * * * *